United States Patent
Chou et al.

(10) Patent No.: US 9,363,911 B2
(45) Date of Patent: Jun. 7, 2016

(54) READER APPARATUS

(71) Applicant: CHANT SINCERE CO., LTD., New Taipei (TW)

(72) Inventors: Chun-Chi Chou, New Taipei (TW); Yu-Chien Chueh, New Taipei (TW); Chen-An Wu, New Taipei (TW); Chih-Chien Lin, New Taipei (TW)

(73) Assignee: CHANT SINCERE CO., LTD., New Taipei (TW)

( * ) Notice: Subject to any disclaimer, the term of this patent is extended or adjusted under 35 U.S.C. 154(b) by 9 days.

(21) Appl. No.: 14/303,043

(22) Filed: Jun. 12, 2014

(65) Prior Publication Data

US 2015/0043149 A1  Feb. 12, 2015

(30) Foreign Application Priority Data

Aug. 8, 2013 (TW) ............................. 102128492 A
Sep. 6, 2013 (TW) ............................. 102216841 U

(51) Int. Cl.
  *H05K 7/00* (2006.01)
  *H05K 5/02* (2006.01)
  *G06K 7/00* (2006.01)
  *G06K 19/077* (2006.01)

(52) U.S. Cl.
  CPC ............ *H05K 5/0291* (2013.01); *G06K 7/0021* (2013.01); *G06K 19/07732* (2013.01); *G06K 19/07741* (2013.01); *H05K 5/0282* (2013.01)

(58) Field of Classification Search
  CPC ............ H05K 5/0291; H05K 5/0282; G06K 19/07732; G06K 7/0021; G06K 19/07741
  USPC ............... 361/679.31–679.39, 684, 729, 797; 439/607.22, 607.56, 373; 235/441
  See application file for complete search history.

(56) References Cited

U.S. PATENT DOCUMENTS

| | | | | |
|---|---|---|---|---|
| 7,632,151 B2 * | 12/2009 | Wang | ................... | G06K 7/0021 439/377 |
| 7,679,008 B2 * | 3/2010 | Lee | ................... | G06K 19/07732 174/521 |
| 7,771,215 B1 * | 8/2010 | Ni | ........................ | G06K 19/07 439/131 |
| 7,778,037 B2 * | 8/2010 | Huang | .................. | G06K 19/07 361/737 |
| 8,061,608 B2 * | 11/2011 | Liao | ................... | H01R 13/6658 235/439 |
| 8,167,658 B1 * | 5/2012 | Liu | ........................ | H01R 12/722 439/630 |
| D711,389 S * | 8/2014 | Sun | .......................... | D14/480.5 |
| 8,979,596 B2 * | 3/2015 | Lin | .................... | G06K 19/07741 439/676 |
| 2009/0255991 A1 * | 10/2009 | Liao | .................. | H01R 13/6658 235/441 |
| 2009/0289119 A1 * | 11/2009 | Liao | ...................... | G06K 7/0021 235/441 |
| 2010/0032485 A1 * | 2/2010 | Liao | ...................... | G06K 13/08 235/441 |
| 2010/0123006 A1 * | 5/2010 | Chen | ...................... | G06K 7/0021 235/441 |
| 2011/0300752 A1 * | 12/2011 | Chou | .................. | H01R 13/6658 439/620.21 |
| 2012/0151126 A1 * | 6/2012 | Moore | .................. | G06F 13/382 711/103 |
| 2013/0201622 A1 * | 8/2013 | Liu | ...................... | H05K 5/0278 361/679.32 |
| 2013/0208414 A1 * | 8/2013 | Moser | .................. | G06F 1/1626 361/679.32 |
| 2014/0281139 A1 * | 9/2014 | Smurthwaite | ........ | H05K 5/0278 711/103 |

* cited by examiner

*Primary Examiner* — Hoa C Nguyen
*Assistant Examiner* — Sagar Shrestha
(74) *Attorney, Agent, or Firm* — Bacon & Thomas, PLLC

(57) ABSTRACT

A reader apparatus comprises a first interface module, a second interface module, a storing module and a processor. The first interface module includes a plurality of terminals that are transferring first interface signals. The second interface module includes a plurality of conducting pads which are transferring a second interface signal. The storing module is for storing data. The processor converts storing signals generated by the storing module to the first interface signals or the second interface signals.

11 Claims, 14 Drawing Sheets

READER APPARATUS

CROSS-REFERENCE TO RELATED APPLICATIONS

This application claims the benefit of the filing date under 35 U.S.C. §119(a)-(d) of Taiwan Patent Applications No. 102128492, filed Aug. 8, 2013 and No. 102216841, filed Sep. 6, 2013.

BACKGROUND OF THE INVENTION

1. Field of the Invention

The present invention relates generally to a reader apparatus, and more specifically, to a reader apparatus provided with different transferring interfaces thereof 2. Description of the Related Art Reading devices currently available on the market are able to contain various memory cards, such as CF card, MMC cards, SD card, Micro SD card and M2 cards, etc. By means of the reading device, a purpose for transferring a data signal stored in these memory cards to another electronic product, or alternatively, a purpose of expanding the memory for an electronic product can be achieved.

However, there are enormous kinds of electronic products in which variety specification of transferring interface are provided. When there is a need for exchanging data between different electronic products, it will require different reading devices with different transferring interfaces, since the prior reading device always has only equipped with one kind of transferring interface to thus cost extra money, space and mind for preparing different reading devices with different transferring interface specification with respect to every different electronic product. Moreover, a manufacturer of the reading device is required to manufacture a reading device product by comply the devices with the corresponding transferring interface specification to thus enhance the cost price.

SUMMARY OF THE INVENTION

Accordingly, the purpose of the present invention is to provide a reader apparatus that has different transferring interfaces.

Thus, the reader apparatus of the present invention is provided for plugging to a first electronic device which has a first interface connector, or for plugging to a second electronic device which has a second interface connector.

The reader apparatus of the present invention comprises a circuit board, a first interface module, a second interface module, a storing module and a processor. The first interface module is provided on the circuit board, the first interface module includes an insulative housing and a plurality of terminals provided in the insulative housing, wherein the terminals are electrically connected to the circuit board in correspondence with the first interface connector for transferring first interface signals. The second interface module is provided on a side of the circuit board opposite to the first interface module, the second interface module including a plurality of conducting contacts directly configured on one surface of the circuit board in correspondence with the second interface connector for transferring second interface signals. The storing module is electrically connected with the circuit board for storing data. The processor is electrically connected with the circuit board for converting signals read from the storing data to the first interface signals or the second interface signals; and converting the first interface signals or the second interface signals to signals writing into the storing data.

Preferably, the first interface module is further provided with a first shell provided in at one side of the insulative housing opposite to the circuit board, the terminals are provided in the first shell, and the first shell has a mating slot for mating the first interface connector.

Preferably, the second interface module further includes a second shell defining a receiving space, in which the conducting contacts are disposed, and the receiving space has an opening.

Preferably, the storing module includes an insulative frame provided at one side of the circuit board opposite to the conducting contacts, a plurality of resilient terminals fixed on the insulative frame, and a memory card. A preserved space for the memory card is defined by the insulative frame and the resilient terminals, the resilient terminals have a plurality of soldering portions respectively electrically connected to the circuit board, and a plurality of resilient arms, respectively provided at an opposite end of the soldering portions and electrically connected to the memory card.

Preferably, the first interface module is further provided with a first shell at one side of the insulative housing opposite to the circuit board, the terminals are provided in the first shell, the first housing has a mating slot provided for mating the first interface connector; the reader apparatus further comprises a body case which includes a surrounding wall and an end wall connected with the surrounding wall, wherein an inner space is defined by the surrounding wall and an end wall, and the inner space is fitted around the housing seat, a part of the circuit board, and a part of the second shell, and the end wall has a aperture provided for having the first shell therein.

Preferably, the storing module further includes a card ejecting member, the card ejecting member has an actuator and two correspondences respectively extending from the actuator toward the preserved space; the surrounding wall has a jointing portion and a card ejecting portion which are opposite to each other; the card ejecting portion has a sliding area allowing the actuator to slide therein, and a recession which is formed in the sliding area and is in communication with the inner space for allowing the correspondences to slide therein, the sliding area has a first end and a second end opposite to the first end.

Preferably, the storing module of the present invention is an SIP (System-in-Package) circuit unit.

Preferably, the storing module of the present invention includes a memory unit directly mounted on the circuit board.

Preferably, the reader apparatus of the present invention is adaptable to the first interface receptacle of the first electronic device and the second interface receptacle of the second electronic device. The processor of the reading device is configured to convert the first interface signal into the second interface signal and convert the second interface signal into the first interface signal.

Preferably, the first interface module is designed to comply with USB OTG specification and the second interface module is designed to comply with USB specification.

The present invention has merits as follows. By means of using the first interface module to transfer first interface signals, using the second interface module to transmit second interface signals, and utilizing the storing module for data storage, a processor can be for converting stored signals generated by the storing module to first interface signals or second interface signals, converting the first interface signals or the second interface signals to the stored signals, converting the first interface signals to the second interface signals, and converting the second interface signals to the first interface signals, so that the capability of data transmission between different interfaces can be achieved.

DETAILED DESCRIPTION OF THE EMBODIMENT(S)

Figure 1:
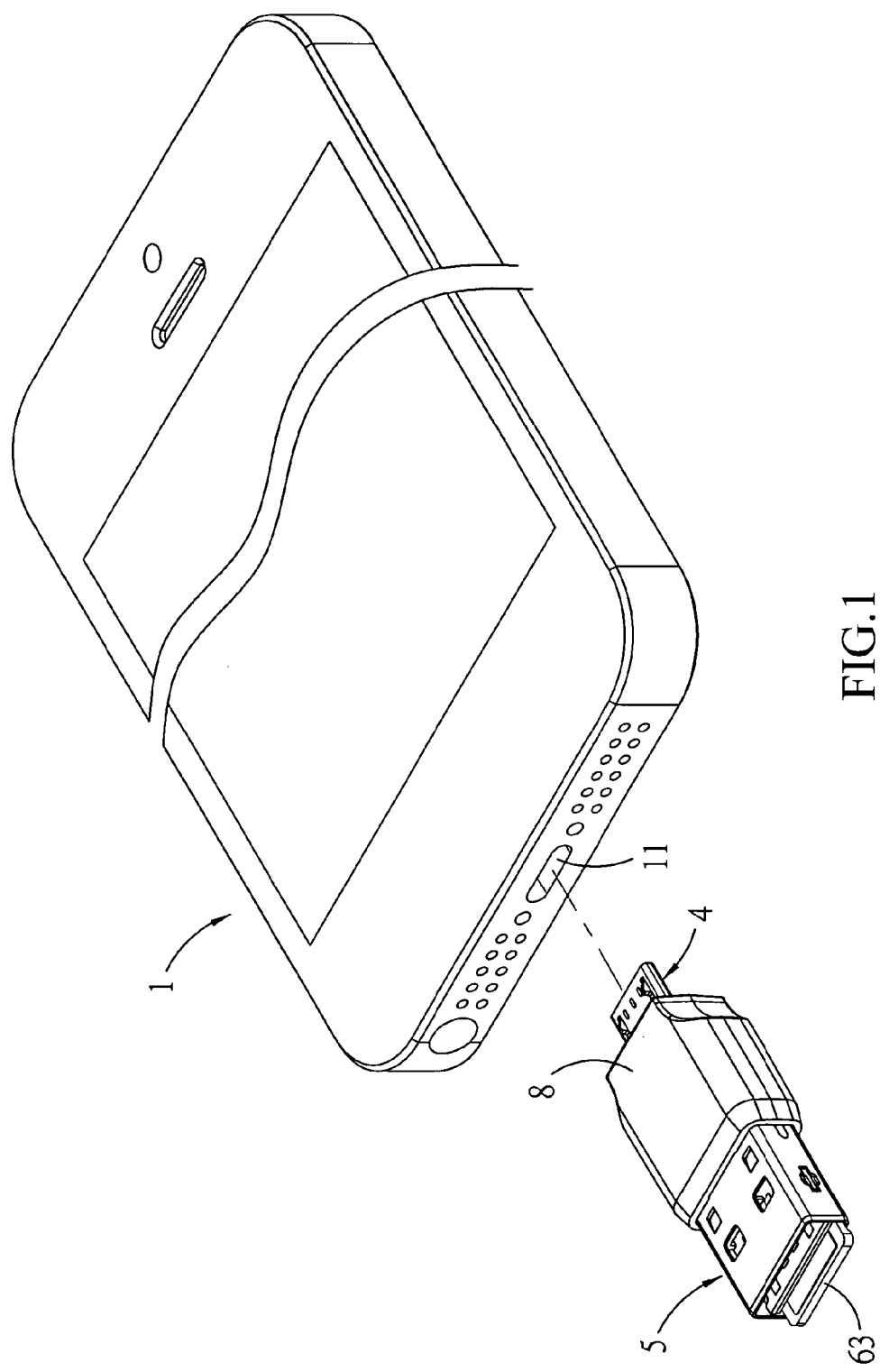
FIG. 1 is a perspective view of a reader apparatus, that is plugged into a first electronic device, according to a first preferred embodiment of the present invention.

To clarify the above objects and effect of the present invention, a more detailed description will be described by referring to the following embodiments and the drawings of the present invention. A similar element will be referred by using the same reference numeral.

Figure 2:
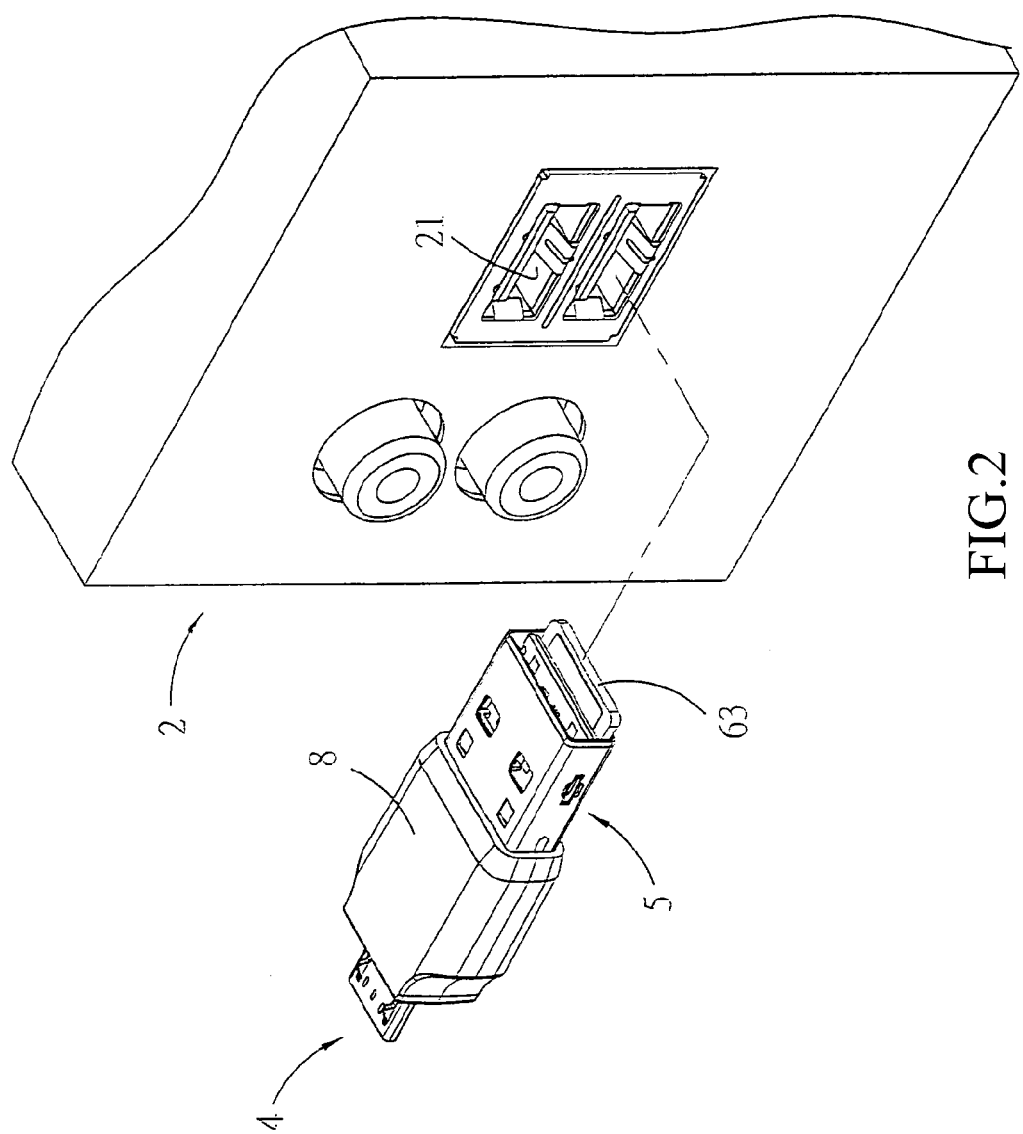
FIG. 2 is a perspective view of a reader apparatus, that is plugged into a second electronic device, according to the preferred embodiment of FIG. 1.
Figure 3:
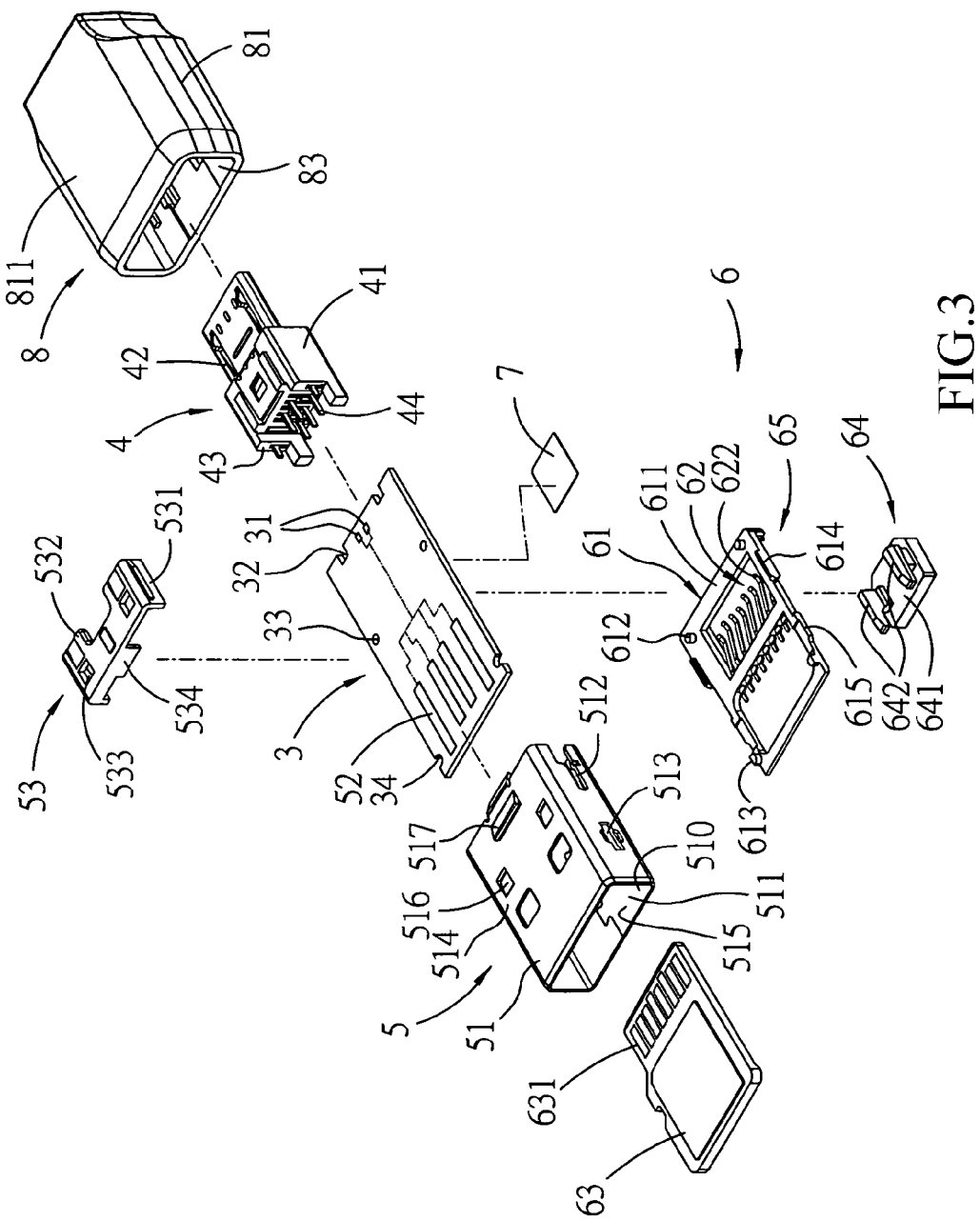
FIG. 3 is an exploded perspective view of the preferred embodiment of FIG. 1.
Figure 4:
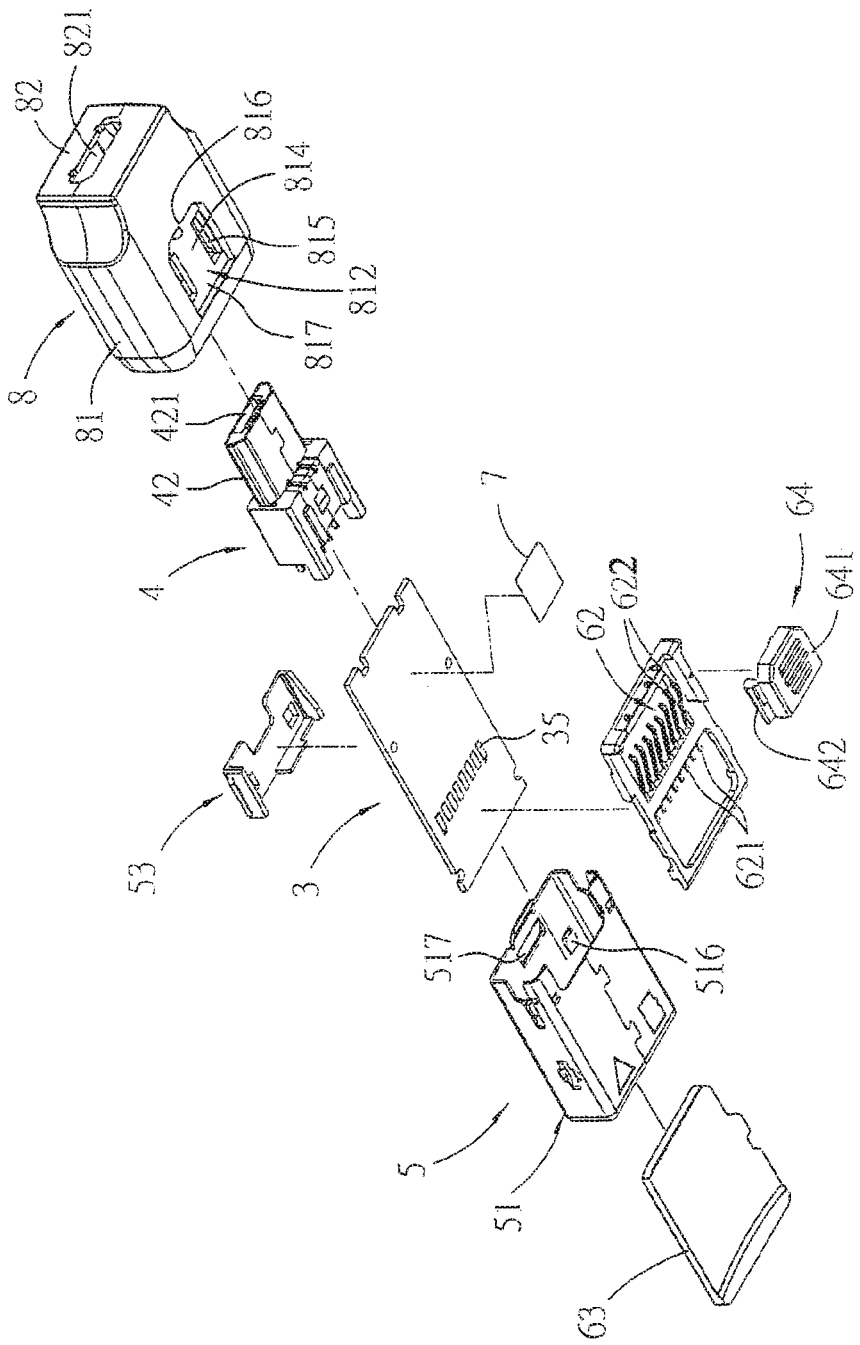
FIG. 4 is an exploded perspective view viewed from another direction corresponding to FIG. 3.

As referring to FIGS. 1-3, a reader apparatus of a first preferred embodiment of the present invention is provided to plug to a first electronic device 1 which has a first interface connector 11 and/or plug to a second electronic device 2 which has a second interface connector 21. In this embodiment, the first electronic device 1 is a handheld device, such as a smart phone. The first interface connector 11 is designed to comply, or in compliance with, the USB OTG (On-The-Go) specification, for example, a micro USB receptacle. The second electronic device 2 is a computer device (host), and the second interface connector 21 is designed to comply, or in compliance, with the USB specification. However, the present invention should not limit to this embodiment. Alternatively, the first electronic device 1 can be a device with receptacle(s) of USB OTG specification, and the second electronic device 2 can be a device with receptacle(s) of USB specification. In this embodiment, the reader apparatus includes a circuit board 3, a first interface module 4, a second interface module 5, a storing module 6, a processor 7, and a body case 8.

As referring to FIGS. 3-6, the circuit board 3 includes: a plurality of connecting pads 31 which are directly formed on the surface of the circuit board 3, two retaining holes 32 that are spaced apart, two first holes 33 which are spaced apart and are provided opposite to the retaining holes 32, two second holes 34 provided between the retaining holes 32 and the first holes 33, and a plurality of soldering pads 35.

The first interface module 4 is provided on the circuit board 3 and includes: a insulative housing 41, a first shell 42 provided at a side of the insulative housing 41 opposite to the circuit board 3, two protrudes 43 which are respectively extended from the insulative housing 41 toward the circuit board 3 and are respectively connected to the retaining holes 32, and a plurality of terminals 44 which are respectively provided in the first shell 42. The terminals 44 are electrically connected with the connecting pads 31 of the circuit board 3. The first shell 42 has a mating slot 421 for mating the first interface connector 11. The terminals 44, the first shell 42, and the first interface connector 11 (as shown in FIG. 1) are corresponding with each other and are all in compliance with the USB OTG specification for transferring first interface signals (i.e., signals for performing USB OTG function.)

The second interface module 5 is disposed on a side of the circuit board 3 opposite to the first interface module 4. The second interface module 5 includes a second shell 51 for defining a receiving space 511, a plurality of conducting contacts 52 that are contained in the receiving space 511, and a stopping member 53. The conducting contacts 52 are directly formed on the surface of the circuit board 3 relative to the second interface connector 21 (as shown in FIG. 2). Both the conducting contacts 52 and the second interface connector 21 are in compliance with the USB specification for transferring second interface signals (i.e. USB signals.) The receiving space 511 has an opening 510 in communication with the outside of the receiving space 511.

Specifically, the second shell 51 has two first cutouts 512 that are located at two opposite sides of the second shell 51, two second cutouts 513 that are located at two opposite sides of the second shell 51, a jointing plate 514, a sealing plate 515 which is opposite to the jointing plate 514, two first protrusions 516 that are respectively extending from the jointing plate 514 toward the sealing plate 515, and a second protrusion 517 which is extending away from the jointing plate 514 toward the sealing plate 515. The stopping member 53 has two side walls 531, a rear wall 532 that connects the two side walls 531, two notches 533 respectively formed on the rear wall 532 for fastening the two first protrusions 516 respectively, and an edge 534 extending from the rear wall 532 toward the circuit board 3. The side walls 531 and the edge 534 are provided on the circuit board 3 for enabling the terminal of the second interface connector 21 (not shown) to push against the edge 534 for preventing the terminals of the second interface 21 from plugging in too deep.

The storing module 6 is electrically connected to the circuit board 3 for storing data. The storing module 6 includes an insulative frame 61 provided on a side of the circuit board 3 opposite to the conducting contacts 52, a plurality of resilient terminals 62 that are fixed on the insulative frame 61, a memory card 63, and a card ejecting member 64. A preserved space 65 is defined by the insulative frame 61 and the resilient terminals 62 for receiving the memory card 63. The memory card 63 has a plurality of pads 631. In this embodiment, the memory card 63 is a SD card, but the present invention is not limited to this, other types of memory cards also can be used. The resilient terminals 62 have a plurality of soldering portions 621 respectively electrically connected to the soldering pads 35 of the circuit board 3, and a plurality of resilient arms 622 which are respectively provided opposite to the soldering portions 621 and are electrically connected to the pads 631 of the memory card 63.

Specifically, the insulative frame 61 includes: a body 611, two first rods 612 that are respectively extending from the body 611 toward the circuit board 3 for jointing to the second holes 34 of the circuit board 3, two second rods 613 that are respectively extending from the body 611 toward the circuit board 3 for jointing to the first holes 33 of the circuit board 3; two first protrudes 614 that are respectively bulged from the two opposite sides of the body 611 for jointing to the first cutouts 512 of the second shell 51, and two second rods 615 that are respectively extending from the two opposite sides of the body 611 for jointing to the second cutouts 513 of the second shell 51. The card ejecting member 64 includes an actuator 641 and two correspondences 642 that are respectively extending from the actuator 641 toward the preserved space 65. The operation of the card ejecting member 64 is further described herein.

The processor 7 is provided on the circuit board 3 for: converting signals read from said storing data to said first interface signals or said second interface signals; and converting said first interface signals or said second interface signals to signals writing into said storing data.

Figure 5:
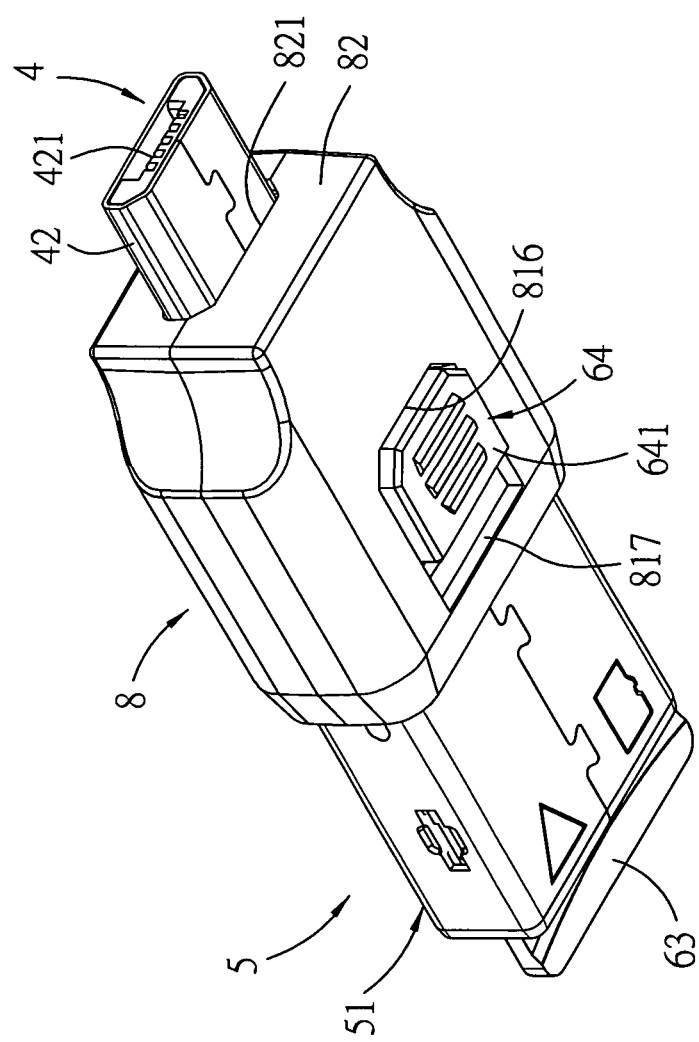
FIG. 5 is a perspective view corresponding to FIG. 4.
Figure 6:
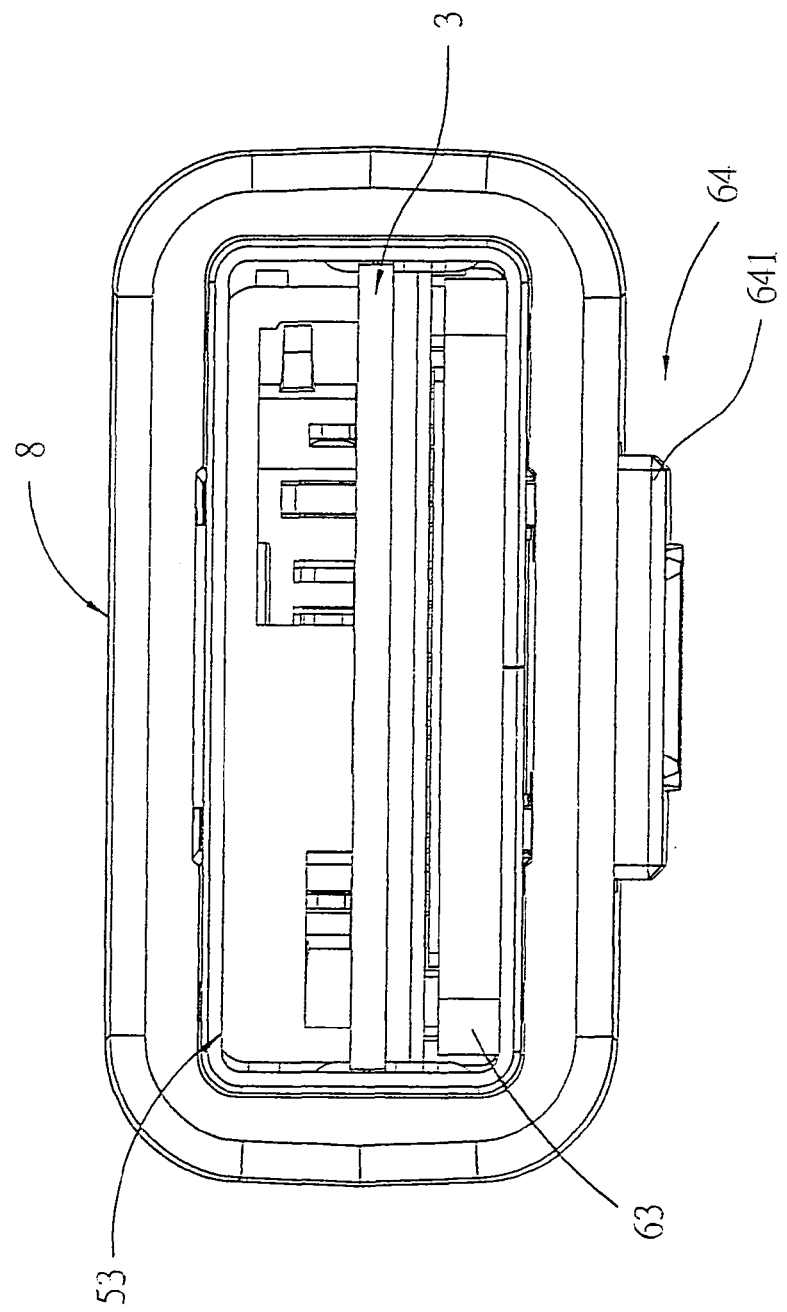
FIG. 6 is a rear view corresponding to FIG. 5.
Figure 7:
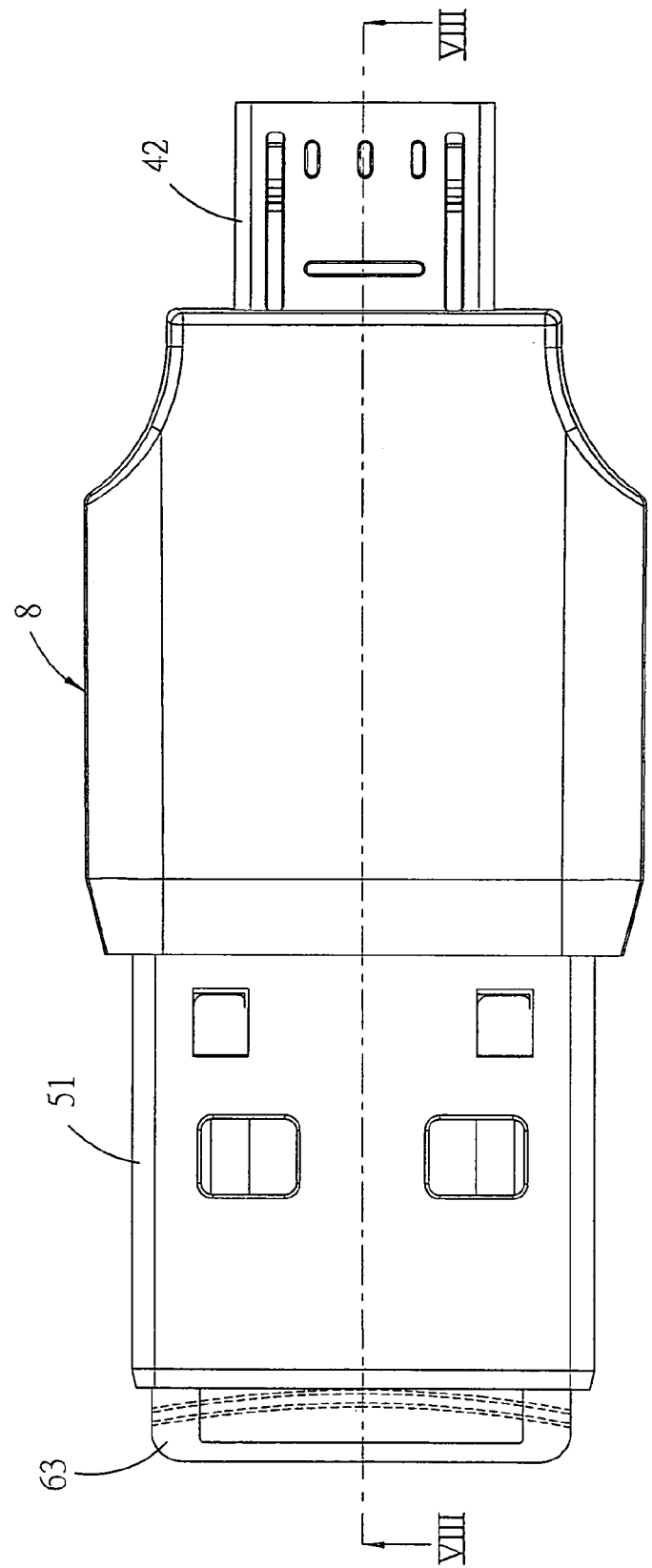
FIG. 7 is a top view corresponding to FIG. 5.
Figure 8:
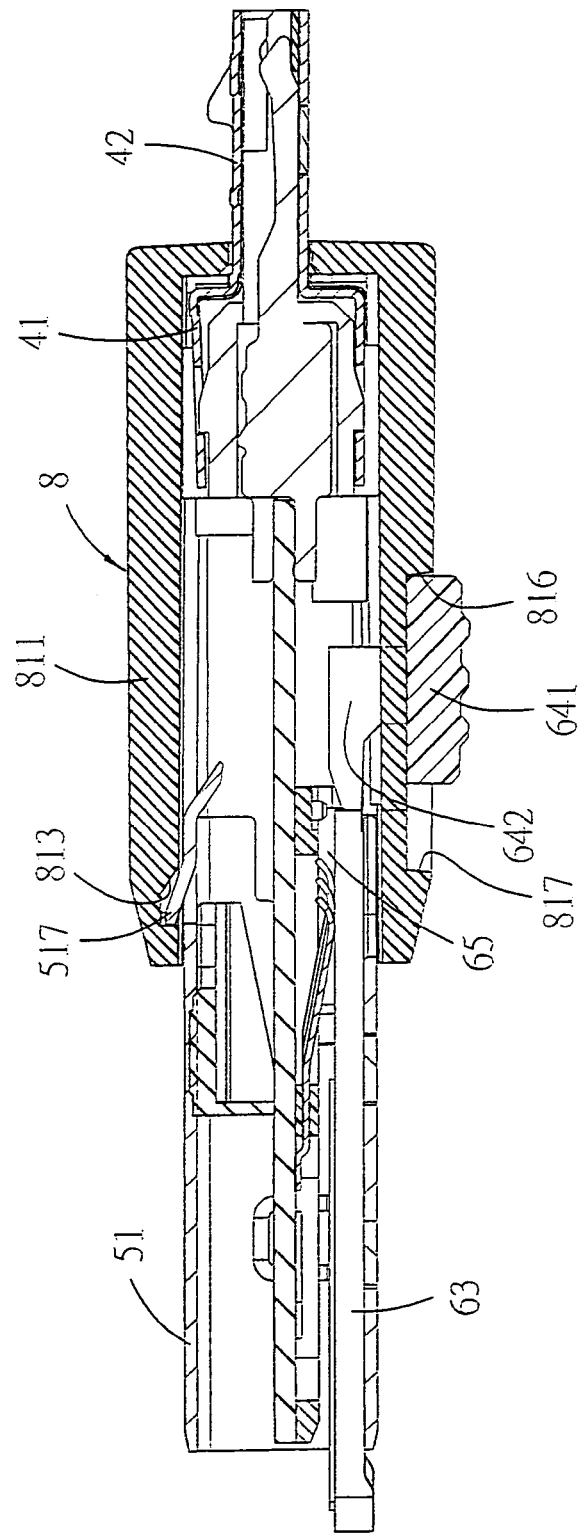
FIG. 8 is a cross-sectional view taken along line VIII-VIII of FIG. 7.
Figure 9:
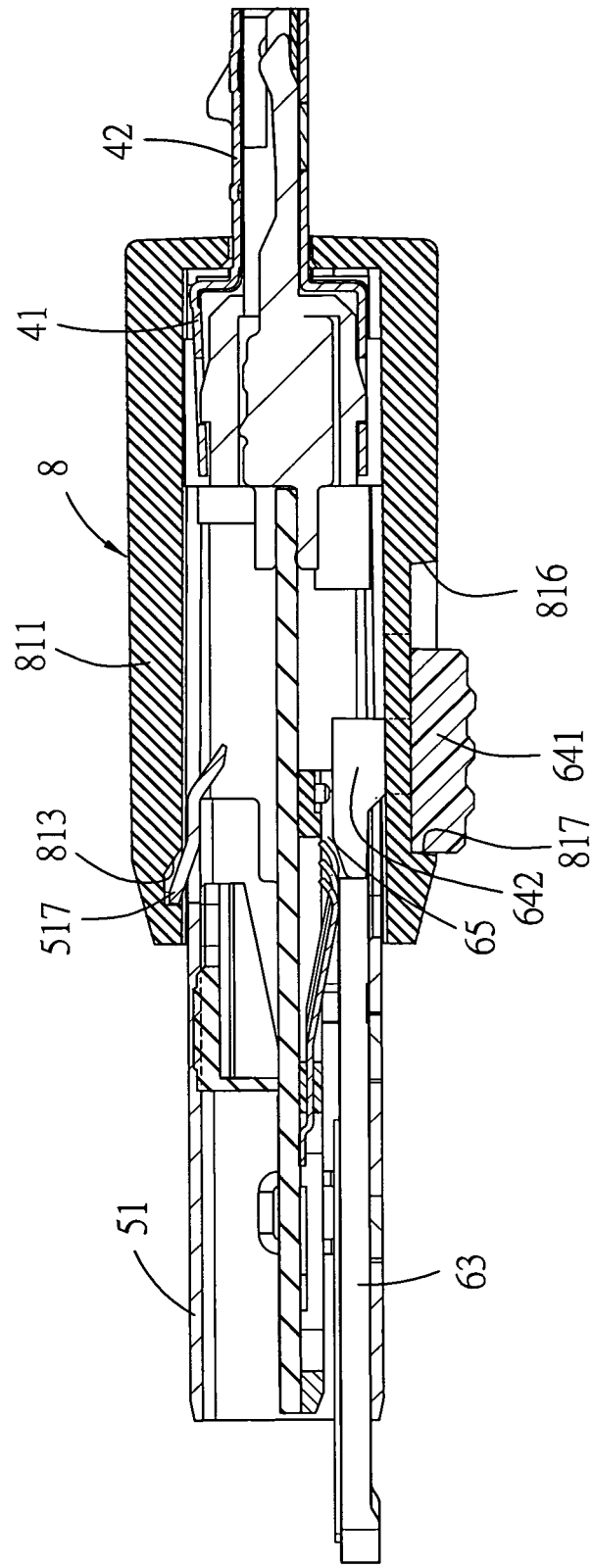
FIG. 9 is a cross-sectional view of an actuator which is operated to cause the correspondences to eject a memory card out of the preserved space.

The body case 8 includes a surrounding wall 81 and an end wall 82 that is connected to one side of the surrounding wall 81. The surrounding wall 81 and the end wall 82 define an inner space 83. The inner space 83 is fitted around by the insulative housing 41, a part of the circuit board 3, and a part of the second shell 51. The surrounding wall 81 has a jointing portion 811 and a card ejecting portion 812, which is opposite to the jointing portion 811. The jointing portion 811 has a cavity 813 (as shown in FIG. 8,) for receiving the second protrusion 517, and the cavity 813 is in communication with the inner space 83. The card ejecting portion 812 has a sliding area 814 for receiving the actuator 641 to slide therein, and two recessions 815 which are formed on the sliding area 814 and are connected to the inner space 83 for receiving the correspondences 642 to slide therein. The sliding area 814 has a first end 816 and a second end 817 which is opposite to the first end 816. The end wall 82 has an aperture 821 for receiving the first shell 42. Referring to FIG. 5 and FIGS. 7-8. When the memory card 63 is plugged into the preserved space 65, the memory card 63 pushes the correspondences 642 of the card ejecting member 64 to push against the first end 816 of the sliding area 814. On the contrary, as shown in FIG. 9, when ejecting a memory card 3, a user can push the actuator 641 by hand to have the operating portion 461 sliding from the first end 816 to the second end 817, and driving the correspondences 642 to eject the memory card 63 out of the preserved space 65. In this embodiment, there are two correspondences 642 and two recessions 815, but these numbers can be increased or decreased depends on the actual requirement during manufacturing process, it is still applicable when there is only one correspondence 642 and one recession 815.

The method of using the reading apparatus in this embodiment is described as follows.

As referring to FIGS. 1-4, the memory card 63 can be plugged into the preserved space 65, and then the mating slot 421 of the first interface module 4 of the reader apparatus can be connected to the first interface connector 11 of the first electronic device 1. By operating a software (not shown) of the first electronic device 1, storing signals generated by the stored data on the memory card 63 can be converted to the first interface signals by the processor 7 and can be transferred to a storing unit (not shown) of the first electronic device 1, and the first interface signals generated by the stored data on the first electronic device 1 can be transferred to the processor 7 to be converted to the stored signals, so that the data on the first electronic device 1 can be backup to the memory card 63.

As referring to FIGS. 2-3, the opening 510 of the second interface module 5 of the reader apparatus can be plugged into the second interface connector 21 of the second electronic device 2. By operating a software (not shown) of the second electronic device 2, storing signals generated by the stored data on the memory card 63 can be converted to the second interface signals by the processor 7 and can be transferred to a storing unit (not shown) of the second electronic device 2, and the second interface signals generated by the second electronic device 2 can be transferred to the processor 7 to be converted to the stored signals, so that the data on the second electronic device 2 can be backup to the memory card 63.

Alternatively, the reader apparatus of the present invention can be simultaneously connected to the first electronic device 1 and the second electronic device 2. Specifically, the mating slot 421 of the first interface module 4 can be plugged into the first interface connector 11 of the first electronic device 1, and the opening 510 of the second interface module 5 can be plugging into the second interface connector 21. In other words, by operating a software (not illustrated in the drawings) of the second electronic device 2, second interface signals generated by the data transmission can be transferred to the processor 7 to be converted to the first interface signals and be stored onto the storing unit of the first electronic device 1. Preferably, by operating a software (not illustrated in the drawings) of the second electronic device 2, a second interface signal generated by the data transmission can be transferred to the processor 7 to be converted to the storing signal, so that the data on the second electronic device 2 can be backup to the memory card 63. In other words, the data on the second electronic device 2 can be transferred to both the first electronic device 1 and the reader apparatus.

Or, the first interface signals generated by the stored data on the first electronic device 1 can be transferred to the processor 7 to be converted to the second interface signals, and be stored on the storing unit of the second electronic device 2. Preferably, by operating a software (not shown) of the first electronic device 1, the first interface signals generated by the data transmission can be transferred to the processor 7 to be converted to the stored signal, so that the data on the first electronic device 1 can be backup to the memory card 63.

In another embodiment, when the memory card 63 is not plugged into the plugging space 65 and the reader apparatus is simultaneously connected to both the first electronic device 1 and the second electric device 2, the reader apparatus of the present invention only serves as a transferring medium between the first electronic device 1 and the second electronic device 2.

Therefore, by using the reader apparatus of the present invention, the data transmission between the first electronic device 1 and the second electronic device 2 can be easier and has more versatile way of transferring data. Additionally, the reading device of the present invention provides more convenience to reading device users in a way that the device does not take extra storage spaces. For the reader apparatus manufacturers, the reader apparatus of the present invention is capable of lowering their production cost in a way that they only need to manufacture the reader apparatus of the present invention, the data transmission between the first electronic device 1 and the electronic device 2 can be achieved.

Figure 10:
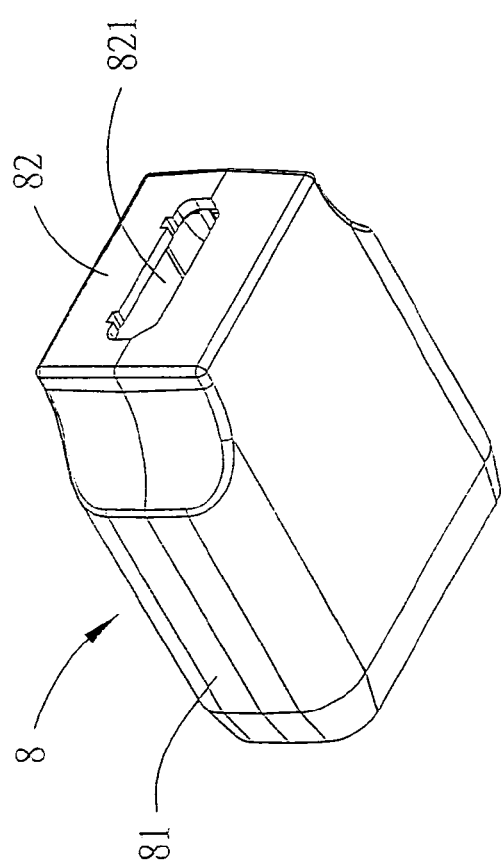
FIG. 10 is a perspective view of a body case according to a second preferred embodiment of the present invention.
Figure 11:
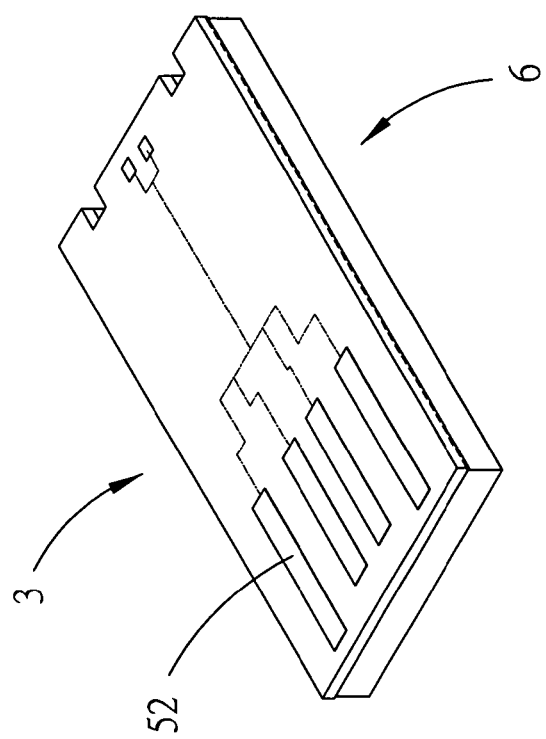
FIG. 11 is a schematic perspective view of a storing module as an SIP circuit unit.
Figure 12:
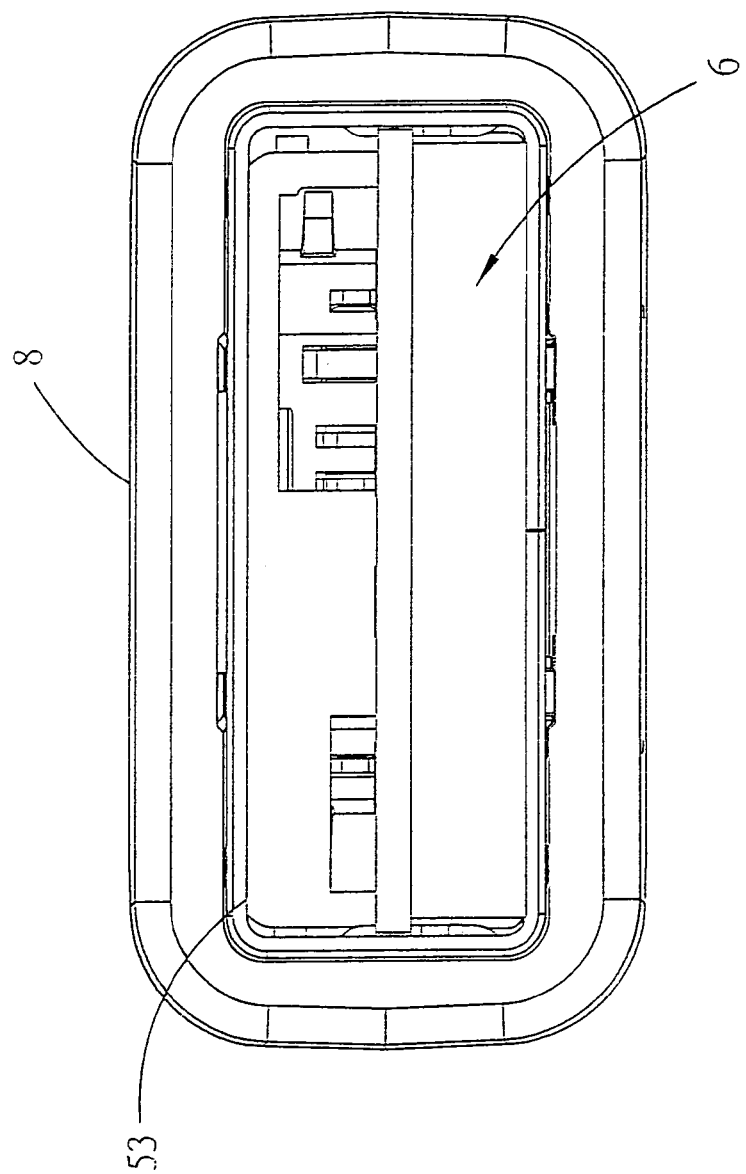
FIG. 12 is a rear view of the preferred embodiment of FIG. 10.

In FIGS. 10-12, the reader apparatus according to the second preferred embodiment of the present invention is illustrated, which is generally similar to that of the first preferred embodiment. The difference between the two reader apparatus is that the aspect of the storing module 6 in the second preferred embodiment is different from the tangible memory card 63 which is plugged into the opening 510, as shown in the first preferred embodiment in FIG. 3. In other words, the storing module 6 in the second preferred embodiment is not provided with the insulative frame 61, the resilient terminals 62, the card ejecting member 64 and the preserved space 65; and the surrounding wall 81 of the body case 8 is not provided with the card ejecting member 812, instead, it is a closed surrounding wall 81.

The storing module 6 is a SIP (System in Package) circuit unit. In other words, the circuit board 3, the processor 7, the conducting pads 52 and a storing chip is integrated in the circuit unit and are integrally packaged with above elements as a system.

Figure 13:
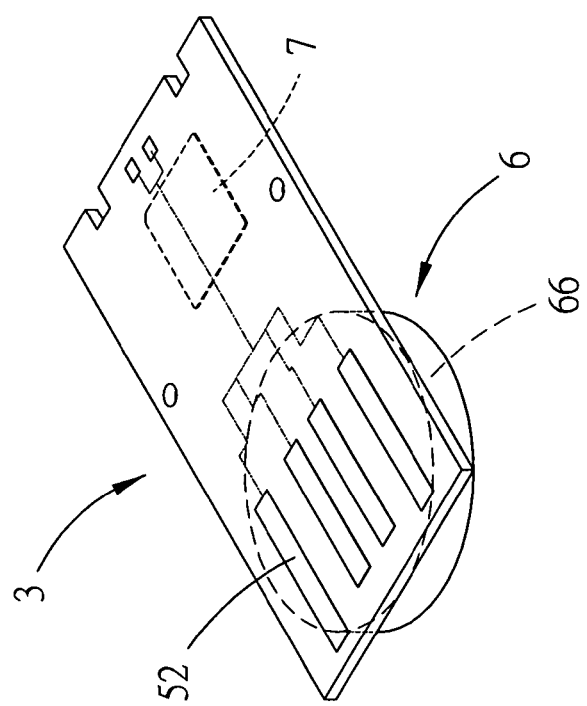
FIG. 13 is a perspective view of a memory unit of the reader apparatus that is directly mounted on a circuit board according to a third preferred embodiment of the present invention.
Figure 14:
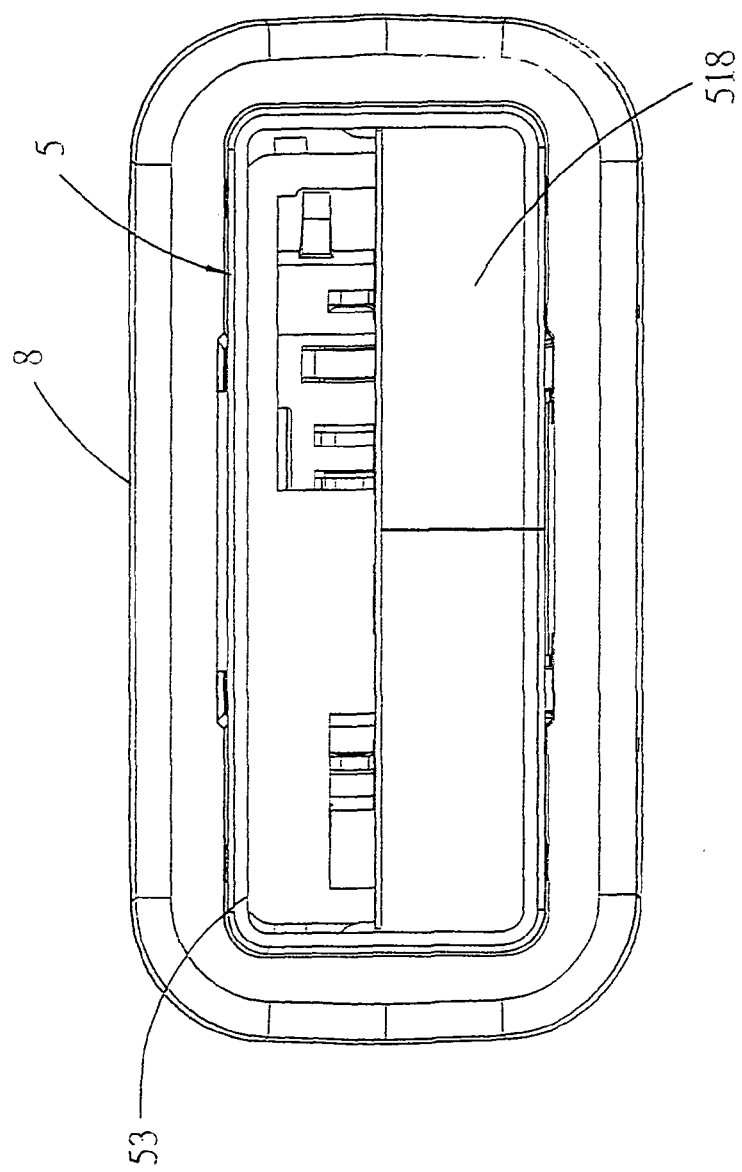
FIG. 14 is a rear view of the preferred embodiment of FIG. 13.

As referring to FIGS. 13-14, the third preferred embodiment of the present invention is generally similar to the second preferred embodiment. The difference between the two embodiments is the aspect of the storing module 6.

The storing module 6 in the third preferred embodiment includes a memory unit 66. The memory unit 66 is a memory chip directly mounted on the circuit board 3 (Chip on Board, COB), and the wire bonding between the memory chip and the circuit board 3 is protected by a sealant.

Preferably, in the second interface module 5, the second shell 51 of the second interface module 5 has a blocking wall 518 which blocks a part of the opening 510 for preventing dirt and oxidization which may affect the function of the memory unit 66 and the circuit board 3.

According to the above description of the reader apparatus of the present invention, by means of the first interface module 4 transfers first interface signals, the second interface module 5 transfers second interface signals, and the storing module 6 transfers storing data, the processor 7 can convert a stored signal generated by the storing module 6 to the first interface signals or the second interface signals; the first interface signals or the second interface signals into the stored signals; the first interface signals into the second interface signals; and the second interface signals into the second interface signals, so that the purpose of transferring data among various interfaces can be achieved.

While the invention has been described in terms of various specific embodiments, those skilled in the art will recognize that the invention can be practiced with modification within the spirit and scope of the claims.

What is claimed is:

1. A reader apparatus adaptable to a first electronic device and a second electronic device, said first electronic device having a first interface connector and said second electronic device having a second interface connector, said reader apparatus comprising:
   a circuit board;
   a first interface module, which is provided on said circuit board, including an insulative housing and a plurality of terminals provided in said insulative housing, wherein said terminals are electrically connected to said circuit board in correspondence with said first interface connector for transferring first interface signals;
   a second interface module, which is provided on a side of said circuit board opposite to said first interface module, including a plurality of conducting contacts directly configured on one surface of said circuit board in correspondence with said second interface connector for transferring second interface signals;
   a storing module electrically connected with said circuit board for storing data, wherein said storing module includes an insulative frame provided on one side of said circuit board opposite to said conducting contacts, a plurality of resilient terminals fixed on said insulative frame and a memory card; and
   a single-chip processor electrically connected with said circuit board for converting signals read from said storing data to said first interface signals or said second interface signals; and converting said first interface signals or said second interface signals to signals writing into said storing data, wherein said single-chip processor is configured to convert said first interface signals to said second interface signals and convert said second interface signals to said first interface signals.

2. The reader apparatus of claim 1, wherein said first interface module is further provided with a first shell at one side of said insulative housing opposite to said circuit board, said terminals are configured in said first shell, and said first shell has a mating slot for mating said first interface connector.

3. The reader apparatus of claim 1, wherein said second interface module further includes a second shell defining a receiving space, in which said conducting contacts are disposed, and said receiving space configures an opening.

4. The reader apparatus of claim 3, wherein a preserved space for said memory card is defined by said insulative frame and said resilient terminals; and said resilient terminals have a plurality of soldering portions respectively electrically connected to said circuit board, and a plurality of resilient arms, respectively provided at an opposite end of the soldering portions and electrically connected to said memory card.

5. The reader apparatus of claim 4, wherein said first interface module is further provided with a first shell at one side of said insulative housing opposite to said circuit board, said terminals are configured in said first shell, said first shell has a mating slot provided for mating said first interface connector, said reader apparatus further includes a body case which includes a surrounding wall and an end wall connected with said surrounding wall, wherein an inner space is defined by said surrounding wall and said end wall, said inner space is fitted around said insulative housing, a part of said circuit board, and a part of said second shell, and said end wall has an aperture provided for inserting said first shell therein.

6. The reader apparatus of claim 5, wherein said storing module further includes a card ejecting member, said card ejecting member has an actuator and correspondences provided the extending from said actuator toward said preserved space, said surrounding wall has a jointing portion and a card ejecting portion which are opposite to each other, said card ejecting portion has a sliding area allowing said actuator to slide therein, and a recession which is formed in said sliding area and is in communication with said inner space for allowing said correspondences to slide therein, said sliding area has a first end and a second end opposite to said first end.

7. The reader apparatus of claim 1, wherein said storing module is an SIP (System-in-Package) circuit unit.

8. The reader apparatus of claim 1, wherein said storing module includes a memory unit directly mounted on said circuit board.

9. The reader apparatus of claim 1, which is adaptable to said first interface connector of said first electronic device and said second interface connector of said second electronic device, wherein said processor is configuring to convert said first interface signals to said second interface signals and convert said second interface signals to said first interface signals.

10. The reader apparatus of claim 1, wherein said first interface module is designed to comply with USB OTG specification and said second interface module is designed to comply with USB specification.

11. The reader apparatus of claim 1, wherein said second interface module further includes a stopping member.

* * * * *